United States Patent [19]
Park et al.

[11] Patent Number: 6,043,523
[45] Date of Patent: Mar. 28, 2000

[54] CHARGE COUPLED DEVICE AND METHOD OF FABRICATING THE SAME

[75] Inventors: Yong Park, Kyungki-do; Do Hyung Kim; Sang Ho Moon, both of Seoul, all of Rep. of Korea

[73] Assignee: LG Semicon Co., Ltd., Chungcheongbuk-Do, Rep. of Korea

[21] Appl. No.: 08/960,213

[22] Filed: Oct. 29, 1997

[30] Foreign Application Priority Data

Jul. 25, 1997 [KR] Rep. of Korea .................... 97/35150

[51] Int. Cl.[7] .................. H01L 27/148; H01L 29/768
[52] U.S. Cl. ................. 257/239; 257/243; 257/246; 257/248; 257/250
[58] Field of Search ...................... 257/239, 247, 257/248, 250, 246, 243; 438/146

[56] References Cited

U.S. PATENT DOCUMENTS 5,289,022  2/1994  Iizuka et al. ............... 257/232
5,401,679  3/1995  Fukusho ....................... 438/144

*Primary Examiner*—Brian Dutton
*Attorney, Agent, or Firm*—Morgan, Lewis & Bockius LLP

[57] ABSTRACT

A charge coupled device is disclosed including: a well formed in a substrate, the well having a conductivity opposite to that of the substrate; a first conductivity type of BCCD region formed on the well; a first lightly doped impurity region formed in a predetermined portion of the first conductivity type of BCCD region; a heavily doped impurity region formed in a predetermined portion of the BCCD region, the heavily doped impurity region having a predetermined distance from the first lightly doped impurity region; a second lightly doped impurity region formed between the first lightly doped impurity region and heavily doped impurity region; a first polysilicon gate formed over a portion of the BCCD region, placed between the first lightly doped impurity region and heavily doped impurity region; and a second polysilicon gate formed over the first lightly doped impurity region. The realization of high speed CCD and simplification of the circuit configuration can be obtained by using one-phase clocking.

12 Claims, 7 Drawing Sheets

CHARGE COUPLED DEVICE AND METHOD OF FABRICATING THE SAME

BACKGROUND OF THE INVENTION

1. Field of the Invention

The present invention relates to a charge coupled device (CCD) and, more particularly, to a horizontal charge coupled device (HCCD) which can be adequately applied to multipixel CCD by raising the clock frequency using one-phase clocking.

2. Discussion of Related Art

FIG. 1 shows the layout of a conventional CCD. Referring to FIG. 1, the CCD includes photodiodes PD which converts an optical signal into electrical signal charges, vertical CCDs (VCCD) which are formed in the vertical direction between the photodiodes, and move the signal charges photoelectric converted by the photodiodes, a horizontal CCD (HCCD) which moves the signal charges received from the VCCD in the horizontal direction, and a sensing amplifier SA.

In the CCD constructed as above, the HCCD must read the charges moved from the VCCD in parallel for a short period of time. This requires faster clocking. Accordingly, 2-phase clocking is, generally, applied to the HCCD, different from the VCCD to which 4-phase clocking is carried out.

A conventional HCCD is explained below with reference to the attached drawings. FIG. 2A is a cross-sectional view of a conventional HCCD, and FIG. 2B shows the potential profile of the HCCD. Referring to FIG. 2A, the HCCD includes a P-type well 13 formed in an N-type semiconductor substrate 11, a buried CCD (BCCD) 15 formed in a predetermined region of P-type well 13 and used as a horizontal charge transfer channel, a gate insulating layer 17 formed on BCCD 15, first and second polysilicon gates 19 and 19a repeatedly formed on gate insulating layer 17 and isolated from each other, and a barrier region 21 formed in a predetermined portion of BCCD 15, placed under second polysilicon gate 19a.

As shown in FIG. 2B, the stepped potential well is maintained by barrier region 21 in the conventional HCCD even when an identical clock is applied to the two polysilicon gates. This moves the charges in one direction. Electrons are accumulated in the bottom of the potential well having lower energy level. This operation is described below in detail.

When t=1, charges accumulate in the potential well under the fourth polysilicon gate to which a high voltage is applied. When t=2, a high voltage is applied to the first and second polysilicon gates, to lower the energy level of the region under the first and second polysilicon gates, and a low voltage is applied to the third and fourth polysilicon gates, to increase the energy level of the region under the third and fourth polysilicon gates. Here, the electrons accumulated in the potential well under the fourth polysilicon gate cannot move to the left because of barrier region 21 under the third polysilicon gate.

When the energy level of the region under the fifth and sixth polysilicon gates is gradually lowered to remove the right energy barrier of the region beneath the fourth polysilicon gate, the electrons move to the potential well under the fifth and sixth polysilicon gates whose energy levels are lower. When the energy level of the region under the fifth and sixth polysilicon gates becomes high sufficiently, the stepped potential well is formed again. Accordingly, the electrons accumulated in the potential well under the fourth polysilicon gate move to the potential well under the sixth polysilicon gate.

The above-described CCD uses 2-phase clocking so that it requires two terminals for externally applying clock signals having the phase difference of 180° therebetween. This complicates the configuration of the periphery circuit of the CCD. Furthermore, it is difficult to realize high speed CCDs because of 2-phase clocking.

SUMMARY OF THE INVENTION

Accordingly, the present invention is directed to a CCD and method of fabricating the same that substantially obviates one or more of the problems due to limitations and disadvantages of the related art.

An object of the present invention is to provide a CCD and method of fabricating the same, in which the number of clock signal input terminal is reduced by using one-phase clocking, to simplify the configuration of periphery circuit and realize a high-speed CCD.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a charge coupled device includes: a well formed in a substrate, the well having a conductivity opposite to that of the substrate; a first conductivity type of BCCD region formed on the well; a first lightly doped impurity region formed in a predetermined portion of the first conductivity type of BCCD region; a heavily doped impurity region formed in a predetermined portion of the BCCD region, the heavily doped impurity region having a predetermined distance from the first lightly doped impurity region; a second lightly doped impurity region formed between the first lightly doped impurity region and heavily doped impurity region; a first polysilicon gate formed over a portion of the BCCD region, placed between the first lightly doped impurity region and heavily doped impurity region; and a second polysilicon gate formed over the first lightly doped impurity region.

To accomplish the object of the present invention, there is provided a method of fabricating a CCD including the steps of: sequentially forming a second conductivity type of well and BCCD region on a first conductivity type of substrate; sequentially forming a gate insulating layer and first polysilicon layer on the BCCD region, and patterned, to form a first polysilicon gate; forming first lightly doped impurity regions in predetermined portions of the BCCD region, placed on both sides of the first polysilicon gate, using impurity ion implantation; forming a second polysilicon layer on the overall surface of the substrate including the first polysilicon gate, and patterned, to form a second polysilicon gate; forming a second lightly doped impurity region and heavily doped impurity region in the BCCD region, by impurity ion implantation using the first and second polysilicon gates as a mask; and forming a third polysilicon layer on the overall surface of the substrate including the first and second polysilicon gates, and patterned, to form a floating gate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
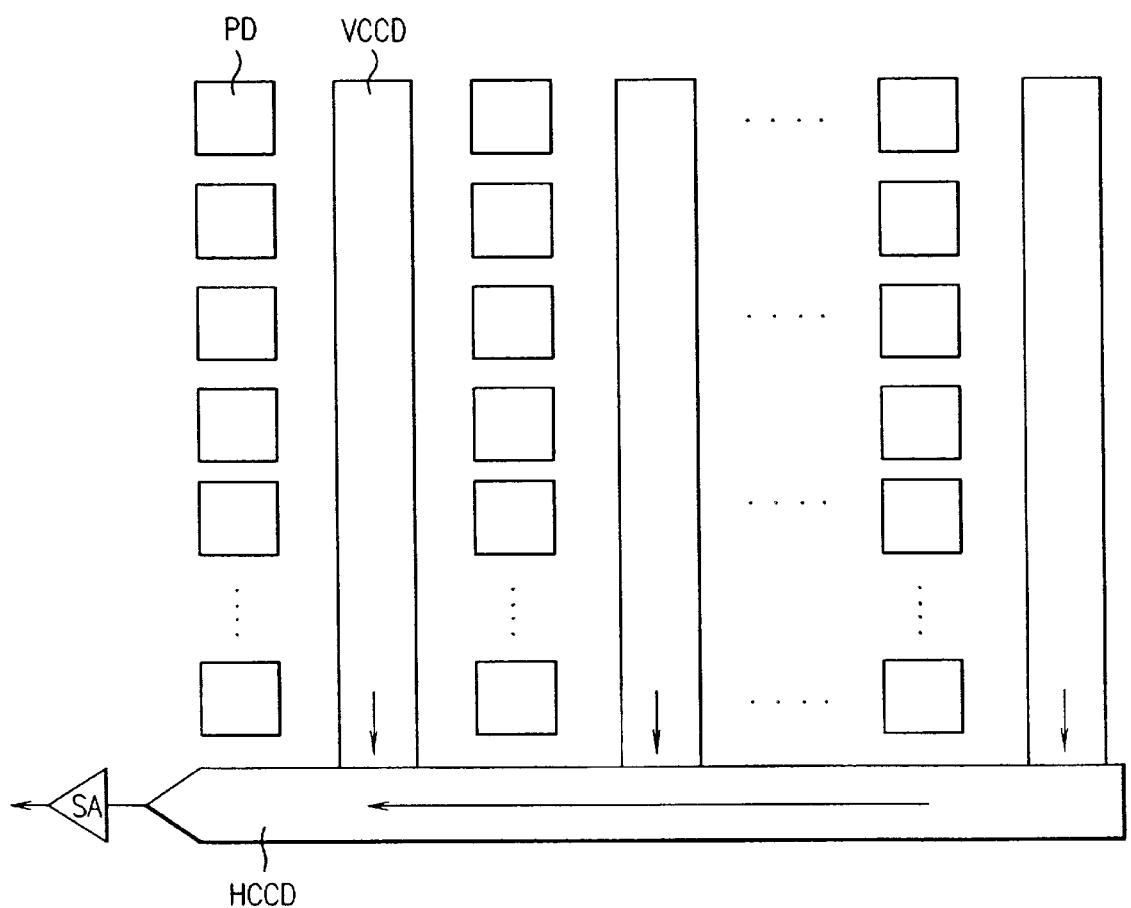
FIG. 1 is a layout of a conventional CCD.
Figure 2A:
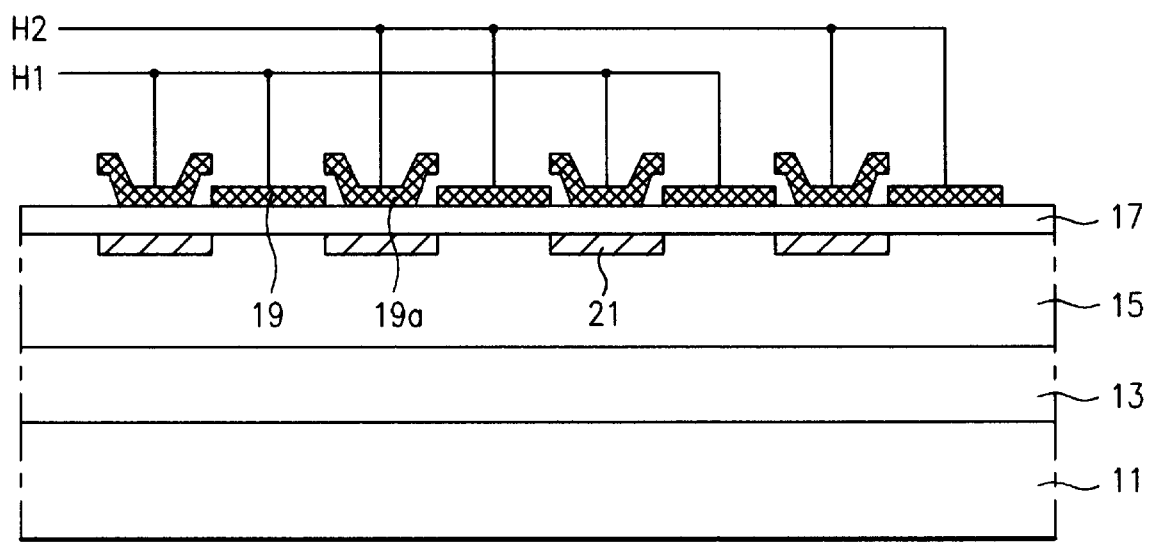
FIGS. 2A and 2B are cross-sectional views of a conventional HCCD using 2-phase clocking.
Figure 2B:
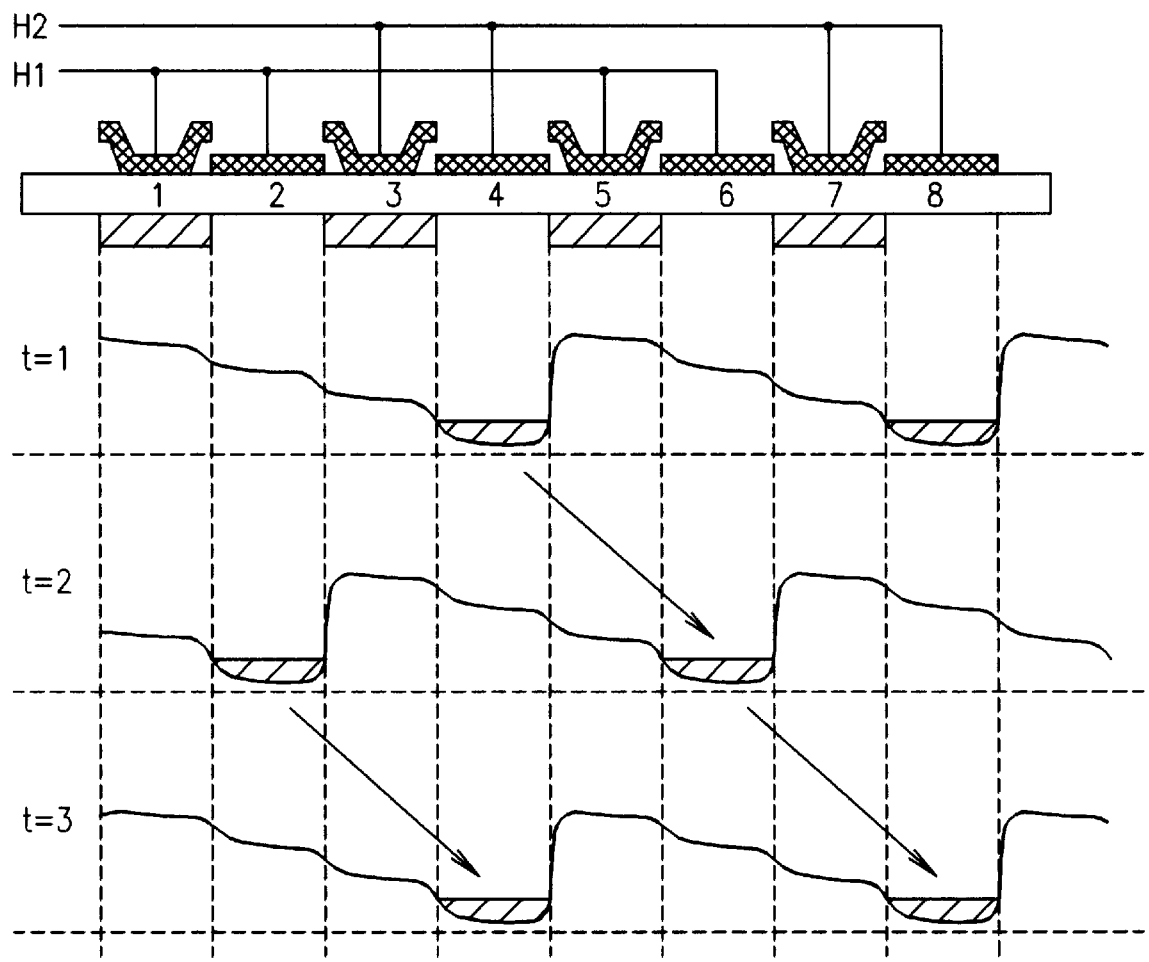
Figure 2B:
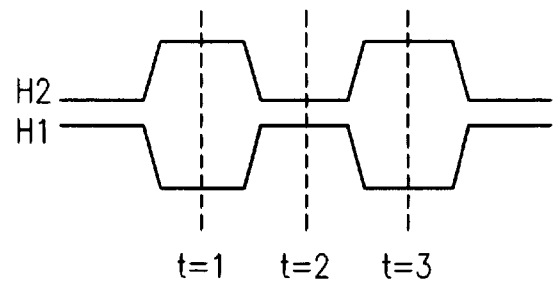
Figure 3:
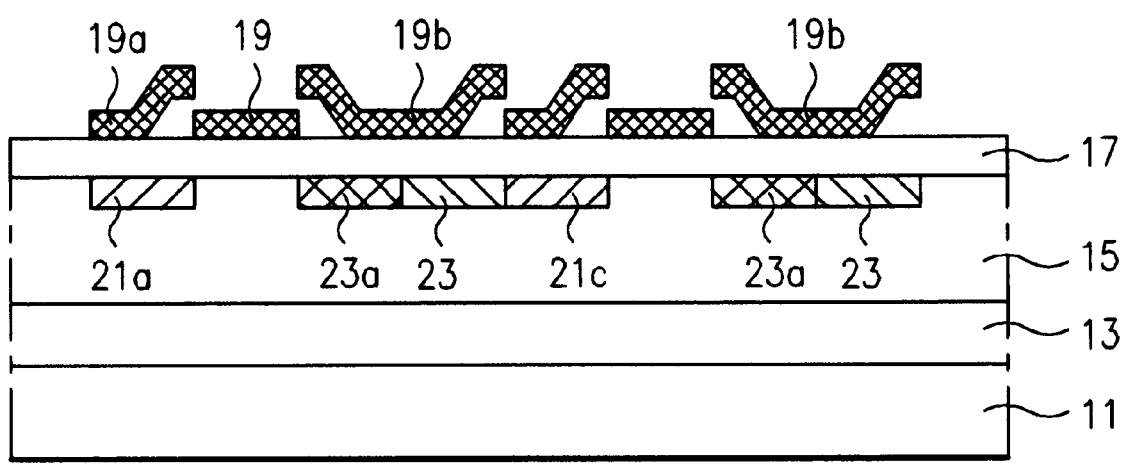
FIG. 3 is a cross-sectional view of an HCCD according to the present invention.
Figure 4:
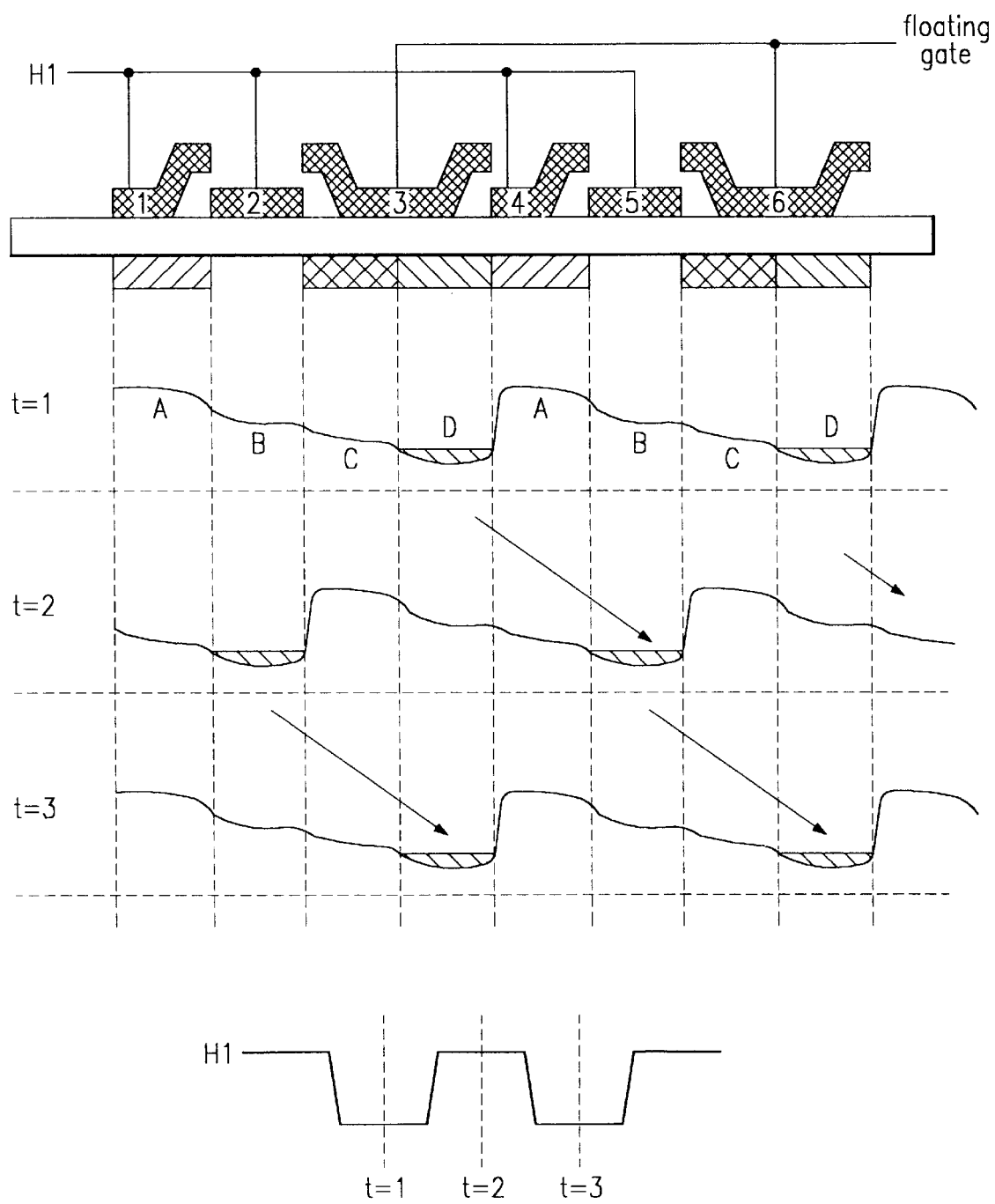
FIG. 4 shows the potential level for explaining the operation of the HCCD according to the present invention.

FIG. 3 is a cross-sectional view of the HCCD of a CCD according to the present invention, and FIG. 4 shows the potential level for explaining the operation of the CCD according to the present invention. Referring to FIG. 3, the HCCD of the present invention includes three patterns of polysilicon gates which are repeatedly formed. One of the three gates is being floated, and the others receive an identical clock signal.

The HCCD of the present invention includes: a second conductivity type of well 13 formed in a first conductivity type of semiconductor substrate 11; an N-type BCCD region 15 formed on second conductivity type of well 13; first, second and third polysilicon gates 19, 19a and 19b formed on BCCD region 15, having a gate insulating layer formed therebetween; first conductivity type of lightly doped impurity regions 21a and 21c formed under second polysilicon gate 19a; a second conductivity type of lightly doped impurity region 23 formed under third polysilicon gate 19b; and a heavily doped impurity region 23a formed on one side of second lightly doped impurity region 23.

In this HCCD structure, first and second polysilicon gates 19 and 19a receive an identical clock signal, and third polysilicon gate 19b is floated. Thus, the third polysilicon gate 19b may be designated as a floating gate. The impurity concentration of the floating gate (third polysilicon gate) is controlled so that its channel potential becomes $(V_{max} - H1_{min})/2$ of the channel potential of the driving gates (first and second polysilicon gates). Heavily doped impurity region 23 has the impurity concentration higher than those of first and second lightly doped impurity regions 21a, 21c and 23. This is because twice of impurity ion implantation processes increase the amount of the impurities in heavily doped impurity region 23. First and second lightly doped impurity regions 21c and 23 have an identical impurity concentration.

The operation of the HCCD according to the present invention is explained below with reference to FIG. 4. Referring to FIG. 4, when t=1, a clock signal of low voltage is simultaneously applied to the first, second, fourth and fifth polysilicon gates. Then, the potential level under the second polysilicon gate becomes lower than that under the first polysilicon gate. This is because P-type first lightly doped impurity region 21a having higher potential level is located under the first polysilicon gate.

Under the third polysilicon gate, there are heavily doped impurity region 23a formed by twice of impurity ion implantation processes, first and second lightly doped impurity regions 21c and 23. Accordingly, the potential levels in heavily doped impurity region 23a and second lightly doped impurity region 23 are different from each other, even though the third polysilicon gate is floated. That is, heavily doped impurity region 23a has the potential level higher than that of second lightly doped impurity region 23 because the third polysilicon gate is being floated. As a result, the potential well is formed in second lightly doped impurity region 23 having the lowest potential level, so that the charges accumulate in the potential well. This process is also applied to the fourth, fifth and sixth polysilicon gates.

When t=2, the clock signal is changed from a low voltage to a high voltage. Thus, a high voltage of clock signal is applied to the first, second, fourth and fifth polysilicon gates. Here, the third polysilicon gate is being floated. There is an abrupt fall in the potential level of the region under the first and second polysilicon gates to which the high voltage of clock signal is applied. The potential level under the fourth and fifth polysilicon gates is also decreased.

In other words, the potential levels under the first, second, fourth and fifth polysilicon gates become lower than those of heavily doped impurity region 23a and second lightly doped impurity region 23. Accordingly, the potential level of second lightly doped impurity region 23 under the third polysilicon gate is lower than that of heavily doped impurity region 23a but higher than that under the fourth polysilicon gate. This potential level is maintained, similar to the case when t=1 because the third polysilicon gate is always being floated. Here, since the potential level under the fourth and fifth polysilicon gates becomes lower than that under the third polysilicon gate, the charges, which were accumulated in the potential well under the third polysilicon gate when t=1, move into the potential well under the fifth polysilicon gate when t=2. The charges accumulated in the potential well under the fifth polysilicon gate cannot move to the region under the sixth polysilicon gate because the sixth polysilicon gate is also floated, similar to the third polysilicon gate.

Figure 5:
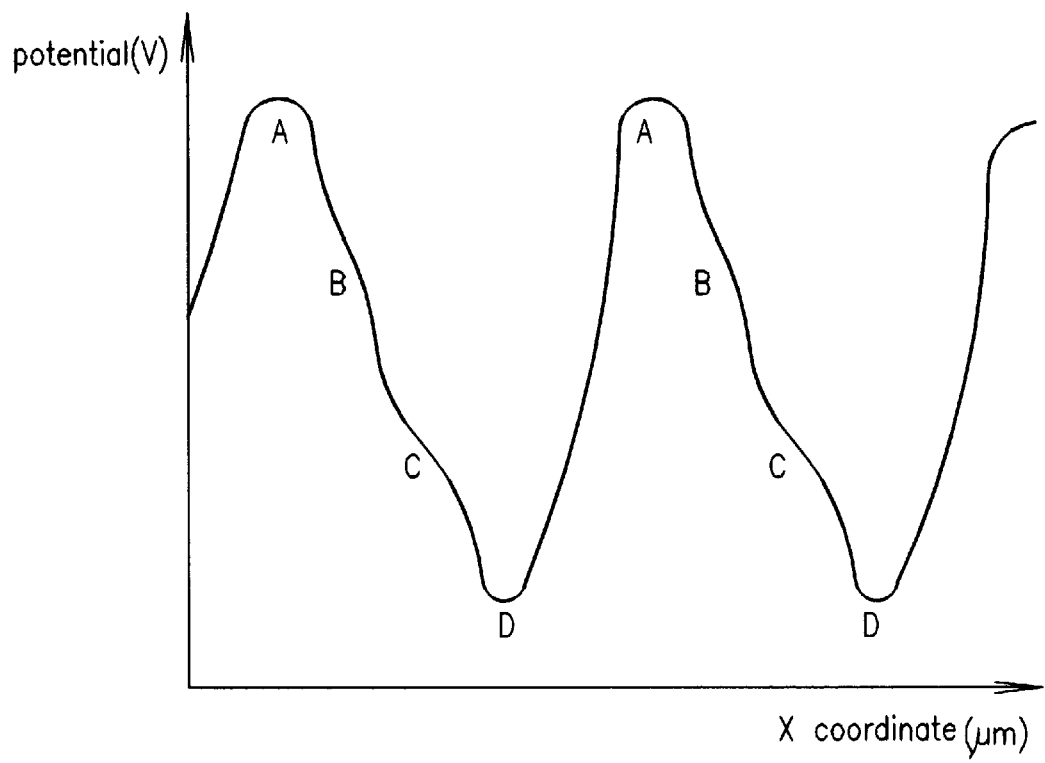
FIG. 5 shows the result of a simulation performed using a CCD according to the present invention.

When t=3, the potential levels are in the same state as those in case of t=1. The charges, which were accumulated in the potential well under the fifth polysilicon gate, move to the region under the sixth polysilicon gate, where second impurity region 23 is located. By repeating the above-described processes, the HCCD moves the charges transmitted from the VCCD to the sensing amplifier SA. Therefore, the HCCD can move the charges with only one clock signal, using the P-type first lightly doped impurity region and P-type heavily doped impurity region which have the potential levels different from each other. FIG. 5 shows the potential profile obtained from a simulation performed using the CCD of the present invention. Referring to FIG. 5, the potential level is gradually changed, to move the charges.

A method of fabricating the CCD of the present invention is explained below with reference to the attached drawings. FIGS. 6A to 6D are cross-sectional views showing a method of fabricating the CCD of the present invention.

Figure 6A:
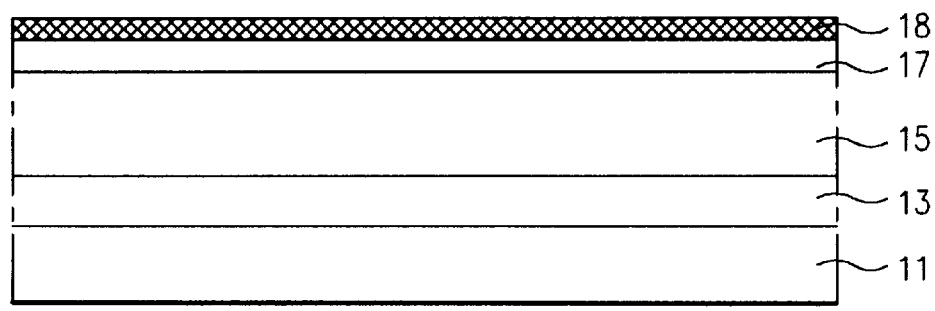
FIGS. 6A and 6D are cross-sectional views showing a method of fabricating the CCD according to the present invention.
Figure 6B:
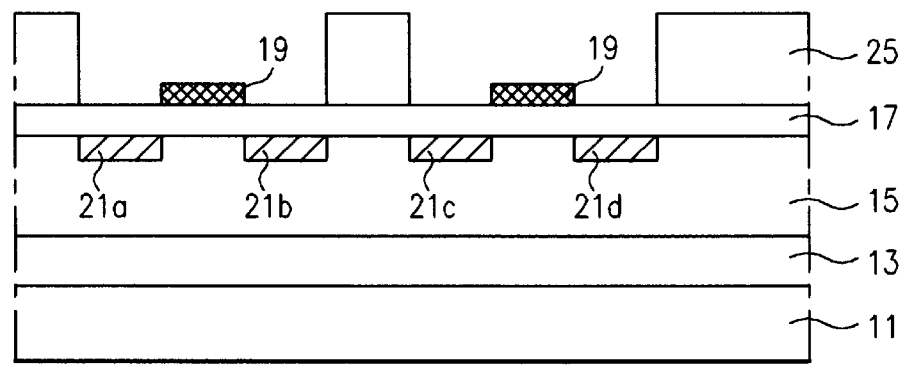

Referring to FIG. 6A, a P-type well 13 is formed in an N-type semiconductor substrate 11, and an N-type BCCD region 15 is formed on P-type well 13. A gate insulating layer 17 is formed on BCCD region 15, and a first polysilicon layer 18 is formed thereon. Referring to FIG. 6B, photoresist (not shown) is deposited on first polysilicon layer 18, and patterned through exposure and development, thereby selectively forming a first polysilicon gate 19. Photoresist 25 is deposited on the overall surface of the substrate including first polysilicon gate 19, and patterned through exposure and development processes. Then, P-type impurity ions are implanted using patterned photoresist 25 as a mask. By doing so, first lightly doped impurity regions 21a, 21b, 21c and 21d are formed in predetermined portions of BCCD region 15, placed on both sides of first polysilicon gate 19.

Figure 6C:
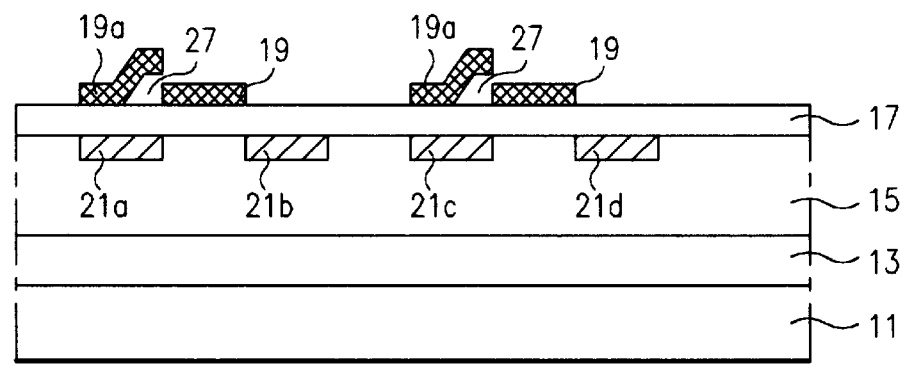
Figure 6D:
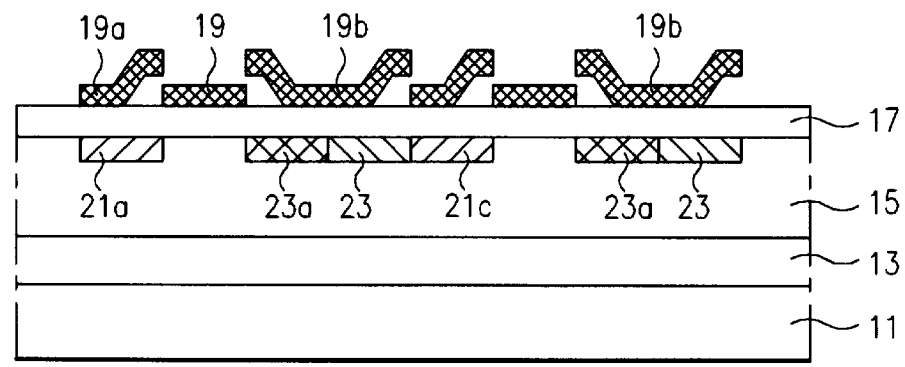

Referring to FIG. 6C, an insulating layer 27 is formed on the overall surface of the substrate including first polysilicon gate 19, and selectively removed, to be left around first polysilicon gate 19. A second polysilicon layer is formed on the overall surface of the substrate including insulating layer 27, and selectively removed, to form a second polysilicon gate 19a on one side of first polysilicon gate 19. Referring to FIG. 6D, P-type impurity ions are implanted by a self-align process using first and second polysilicon gates 19 and 19a as a mask, to form a second lightly doped impurity region 23. Here, a heavily doped impurity region 23a is formed in such a manner that the P-type impurity implanted for forming second impurity region 23 is also implanted into the first lightly doped impurity region. That is, heavily doped impurity region is formed by twice of impurity implantation processes.

Thereafter, a third polysilicon layer is formed on the overall surface of the substrate, and selectively removed, to form a third polysilicon gate 19b on a predetermined portion of gate insulating layer 17, placed on heavily doped impurity region 23a and second lightly doped impurity region 23. As a result, under third polysilicon gate 19b, there are heavily doped impurity region 23a formed by twice of impurity ion implantation processes, and second lightly doped impurity region 23, which have the potential levels different from each other.

As described above, according to the present invention, the high speed CCD can be realized because the charges are transmitted using one-phase clocking. Furthermore, only one clock signal is needed to operate the CCD, resulting in simplification of the configuration of its periphery circuit.

It will be apparent to those skilled in the art that various modifications and variations can be made in the CCD and method of fabricating the same of the present invention without departing from the spirit or scope of the invention. Thus, it is intended that the present invention cover the modifications and variations of this invention provided they come within the scope of the appended claims and their equivalents.

What is claimed is:

1. A charge coupled device (CCD) comprising:

a well formed in a substrate, the well having a conductivity opposite to that of the substrate;

a first conductivity type of BCCD region formed on the well;

a first lightly doped impurity region formed in a portion of the first conductivity type of the BCCD region;

a heavily doped impurity region formed in a portion of the BCCD region, the heavily doped impurity region having a distance from the first lightly doped impurity region;

a second lightly doped impurity region formed between the first lightly doped impurity region and the heavily doped impurity region;

a first polysilicon gate formed over a portion of the BCCD region, and placed between the first lightly doped impurity region and the heavily doped impurity region; and a second polysilicon gate formed over the first lightly doped impurity region.

2. The CCD as claimed in claim 1, wherein the heavily doped impurity region is formed by twice of impurity implantation processes so that its impurity concentration is higher than that of the second lightly doped impurity region.

3. The CCD as claimed in claim 1, wherein the first lightly doped impurity region is formed in a portion of the BCCD region, and placed on both sides of the first polysilicon gate.

4. The CCD as claimed in claim 1, wherein an identical clock signal is applied to the first and second polysilicon gates.

5. The CCD as claimed in claim 1, wherein a floating gate is formed on the heavily doped impurity region and second lightly doped impurity region.

6. The CCD as claimed in claim 1, wherein the substrate is N-type, and the heavily doped impurity region, the first and second lightly doped impurity regions are P-type.

7. The CCD as claimed in claim 1, wherein the first and second polysilicon gates, and the BCCD region have a gate insulating layer formed therebetween.

8. A charge coupled device (CCD) comprising:

a second conductivity type of well formed in a first conductivity type of substrate;

a first conductivity type of BCCD region formed on the second conductivity type of well;

a first lightly doped impurity region formed in portions of the first conductivity type of the BCCD region;

a heavily doped impurity region formed in a portion of the BCCD region, the heavily doped impurity region having a distance from the first lightly doped impurity region;

a second lightly doped impurity region formed between the heavily doped impurity region and first lightly doped impurity region;

a first polysilicon gate formed over a portion of the BCCD region, placed between the first lightly doped impurity region and heavily doped impurity region;

a second polysilicon gate formed over the first lightly doped impurity region; and a floating gate formed over the heavily doped impurity region and the second lightly doped impurity region.

9. The CCD as claimed in claim 8, wherein the floating gate covers the heavily doped impurity region and the second lightly doped impurity region.

10. The CCD as claimed in claim 8, wherein the floating gate is formed of polysilicon.

11. The CCD as claimed in claim 8, wherein the channel potential of the floating gate is as high as $(V_{max}-V_{min})/2$ of the channel potential of the first and second polysilicon gates, where $V_{max}$ and $V_{min}$ are maximum and minimum channel potentials, respectively.

12. The CCD as claimed in claim 8, wherein the BCCD region is implanted with P-type impurity for maintaining the floating gate in float state.

* * * * *